(12) United States Patent
Abu-Surra et al.

(10) Patent No.: US 8,301,974 B2
(45) Date of Patent: Oct. 30, 2012

(54) SYSTEM AND METHOD FOR LOW COMPLEXITY RAPTOR CODES FOR MULTIMEDIA BROADCAST/MULTICAST SERVICE

(75) Inventors: Shadi Abu-Surra, Richardson, TX (US); Farooq Khan, Allen, TX (US); Jianzhong Zhang, Irving, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 496 days.

(21) Appl. No.: 12/586,864

(22) Filed: Sep. 29, 2009

(65) Prior Publication Data

US 2010/0100791 A1    Apr. 22, 2010

Related U.S. Application Data

(63) Continuation-in-part of application No. 12/384,519, filed on Apr. 6, 2009.

(60) Provisional application No. 61/196,926, filed on Oct. 22, 2008.

(51) Int. Cl.
*H03M 13/00*    (2006.01)

(52) U.S. Cl. .......................... 714/758; 714/746; 714/810
(58) Field of Classification Search .................. None
See application file for complete search history.

(56) References Cited

U.S. PATENT DOCUMENTS

| 7,971,129 B2* | 6/2011 | Watson et al. ............... 714/784 |
| 2005/0242974 A1* | 11/2005 | Shokrollahi et al. ............ 341/50 |
| 2008/0069242 A1* | 3/2008 | Xu et al. ................. 375/240.24 |
| 2009/0189792 A1* | 7/2009 | Shokrollahi et al. ............ 341/51 |
| 2011/0258510 A1* | 10/2011 | Watson et al. ............... 714/752 |

* cited by examiner

*Primary Examiner* — John Trimmings

(57) ABSTRACT

A system and method for encoding symbols in a wireless communication is provided. The system and method includes a transmitter configured to encode data transmissions. The transmitter includes a raptor encoder configured to perform a coding operation. The raptor encoder generates intermediate symbols without using a half-code such that the intermediate symbols consist of precoded symbols and parity symbols. Thereafter, the intermediate symbols are encoded using a Luby Transform to produce and output encoded symbols. The transmitter further is configured to transmit one or more of the source symbols, parity symbols or encoded symbols.

40 Claims, 7 Drawing Sheets

SYSTEM AND METHOD FOR LOW COMPLEXITY RAPTOR CODES FOR MULTIMEDIA BROADCAST/MULTICAST SERVICE

CROSS-REFERENCE TO RELATED APPLICATION(S) AND CLAIM OF PRIORITY

The present application is a continuation-in-part of U.S. patent application Ser. No. 12/384,519, entitled "SINGLE-STAGE DECODER FOR RAPTOR CODES," filed on Apr. 6, 2009 and U.S. Provisional Patent Application Ser. No. 61/196,926, entitled "SINGLE-STAGE DECODER FOR RAPTOR CODES", filed on Oct. 22, 2008. U.S. patent application Ser. No. 12/384,519 and U.S. Provisional Patent Application No. 61/196,926 are assigned to the assignee of the present application and are hereby incorporated by reference into the present application as if fully set forth herein. The present application hereby claims priority under 35 U.S.C. §120 to U.S. patent application Ser. No. 12/384,519 and U.S. Provisional Patent Application No. 61/196,926.

TECHNICAL FIELD OF THE INVENTION

The present application relates generally to decoding wireless transmission and, more specifically, to an encoder and a decoder configured to vary a complexity based on a packet erasure rate.

BACKGROUND OF THE INVENTION

Traditional raptor decoders, such as described in 3GPP TS 26.346: "Multimedia Broadcast/Multicast Service (MBMS); Protocols and codecs", version 7.8.0, are two stage decoders. The disadvantage of such a staged process appears when the system packet erasure rate is low (i.e., number of erased source symbols is small). Even if only one source symbol is erased during the transmission, the decoder still needs to compute all the intermediate symbols to recover the erased source symbol. Moreover the computational complexity of this staged decoder is dominated by the computational complexity needed to compute the intermediate symbols. Consequently, the computational complexity of the staged decoder does not depend on the packet erasure rate.

These traditional decoders work fine when the erasure rate is high. However, in a typical wireless communication link that is protected by a turbo code at the physical layer, the packet erasure rate is approximately one percent (1%). In such a low erasure rate scenario, the computation complexity needed to recover the 1% of the source symbols is approximately the same as that needed to recover all of the source symbols. Accordingly, the efficiency of such a decoder, when need to recover in a system with a low erasure rate, is low.

An additional drawback in the existing 3GPP raptor code, is the existence of the high density Half-code as part of its generating matrix. This is because the used decoder needs to find the inverse of this generating matrix. Note that this matrix is, in general, a sparse matrix, but has a high density of non-zero elements (ones) in the portion related to the Half-code. As the complexity of finding the inverse of a sparse matrix is proportional to the number of non-zero elements in it, one can reduce the computational complexity by removing the Half-code segment. One more drawback in the existing 3GPP raptor code is that it lacks the ability to provide unequal error protection to different classes of packets in the source block (e.g., base-layer packets and enhancement-layer packets).

SUMMARY OF THE INVENTION

A wireless communications device capable of transmitting encoded transmissions in a wireless communications network is provided. The wireless communications device includes a raptor encoder. The raptor encoder includes a precoder stage that is configured to produce a plurality of precoded symbols. The raptor encoder also includes a Low Density Parity Check (LDPC) stage that is configured to produce a plurality of parity symbols. The raptor encoder further includes a Luby Transform (LT) stage that is configured to encode a plurality of intermediate codes to produce a plurality of encoded symbols. The plurality of intermediate symbols consists of the precoded symbols and the plurality of parity symbols. The raptor encoder is configured to receive a plurality of source symbols and an output at least the plurality of encoded symbols.

A transmitter, for use in a wireless communications device, capable of raptor-encoding transmissions in a wireless communications network is provided. The transmitter includes a raptor encoder. The raptor encoder includes a precoder stage that is configured to produce a plurality of precoded symbols; a LDPC stage that is configured to produce a plurality of parity symbols; and a LT stage that is configured to encode a plurality of intermediate codes to produce a plurality of encoded symbols. The plurality of intermediate symbols consists of the precoded symbols and the plurality of parity symbols. The raptor encoder is configured to receive a plurality of source symbols and an output at least the plurality of encoded symbols.

A method for encoding symbols to enable the recovery of erased symbols in a transmission in a wireless communications network is provided. The method includes receiving a plurality of source symbols. The method also includes pre-coding at least a portion of the plurality of source symbols to produce a plurality of precoded symbols and encoding at least a portion of the plurality of source symbols to produce a plurality of parity symbols. Further, the method includes generating a plurality of intermediate symbols from only the plurality of precoded symbols and the plurality of parity symbols. The method further includes encoding, with a Luby Transform, the intermediate symbols to produce a plurality of encoded symbols and outputting the plurality of encoded symbols.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

Figure 1:
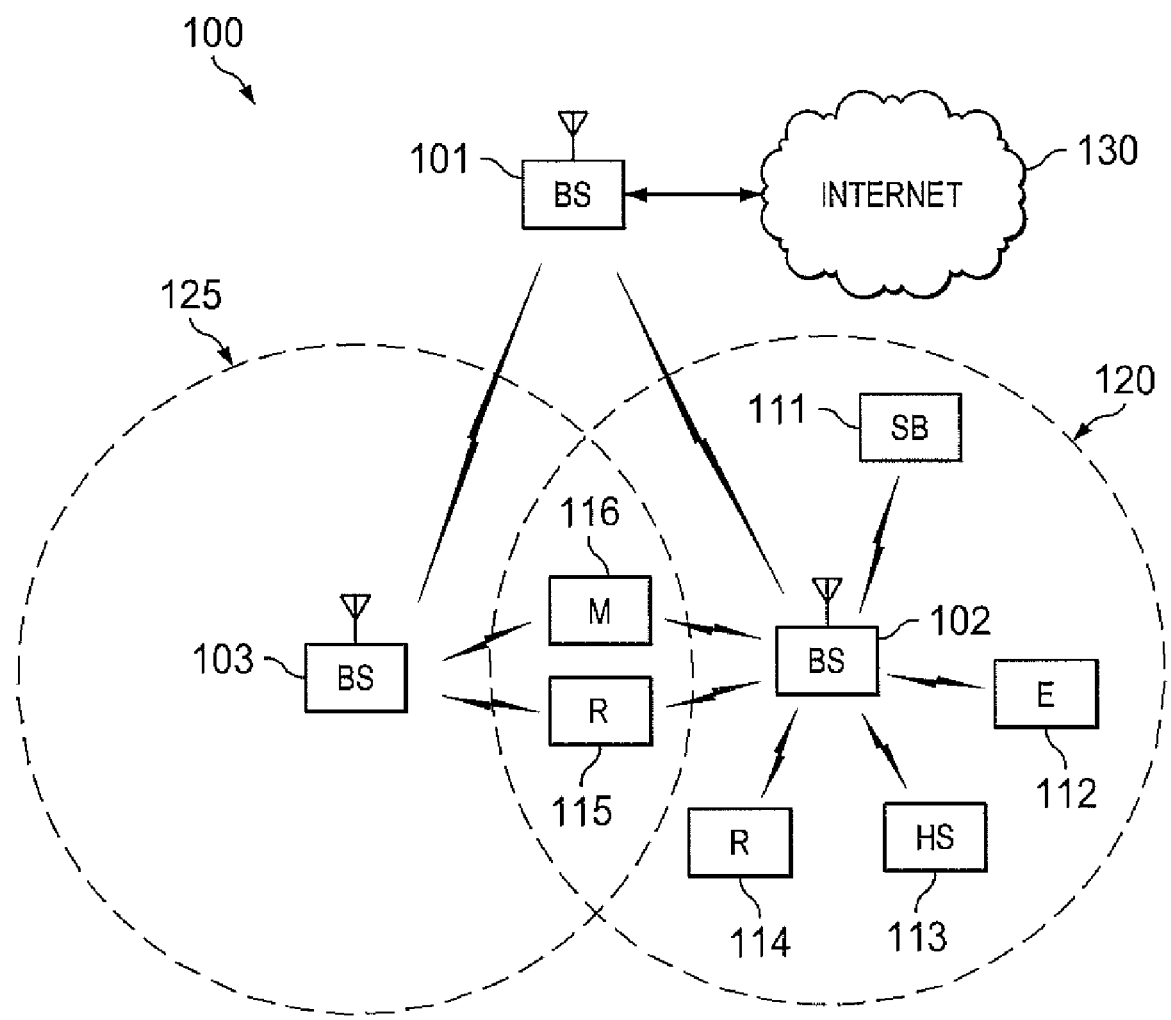
FIG. 1 illustrates an exemplary wireless network 100, which transmits ACK/NACK messages according to an exemplary embodiment of the disclosure.

FIG. 1 illustrates an exemplary wireless network 100, which transmits ACK/NACK messages according to the principles of the present disclosure. In the illustrated embodiment, wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of subscriber stations within coverage area 120 of base station 102. The first plurality of subscriber stations includes subscriber station 111, which may be located in a small business (SB), subscriber station 112, which may be located in an enterprise (E), subscriber station 113, which may be located in a WiFi hotspot (HS), subscriber station 114, which may be located in a first residence (R), subscriber station 115, which may be located in a second residence (R), and subscriber station 116, which may be a mobile device (M), such as a cell phone, a wireless laptop, a wireless PDA, or the like.

Base station 103 provides wireless broadband access (via base station 101) to Internet 130 to a second plurality of subscriber stations within coverage area 125 of base station 103. The second plurality of subscriber stations includes subscriber station 115 and subscriber station 116. In an exemplary embodiment, base stations 101-103 may communicate with each other and with subscriber stations 111-116 using OFDM or OFDMA techniques.

Base station 101 may be in communication with either a greater number or a lesser number of base stations. Furthermore, while only six subscriber stations are depicted in FIG. 1, it is understood that wireless network 100 may provide wireless broadband access to additional subscriber stations. It is noted that subscriber station 115 and subscriber station 116 are located on the edges of both coverage area 120 and coverage area 125. Subscriber station 115 and subscriber station 116 each communicate with both base station 102 and base station 103 and may be said to be operating in handoff mode, as known to those of skill in the art.

Subscriber stations 111-116 may access voice, data, video, video conferencing, and/or other broadband services via Internet 130. In an exemplary embodiment, one or more of subscriber stations 111-116 may be associated with an access point (AP) of a WiFi WLAN. Subscriber station 116 may be any of a number of mobile devices, including a wireless-enabled laptop computer, personal data assistant, notebook, handheld device, or other wireless-enabled device. Subscriber stations 114 and 115 may be, for example, a wireless-enabled personal computer (PC), a laptop computer, a gateway, or another device.

Figure 2A:
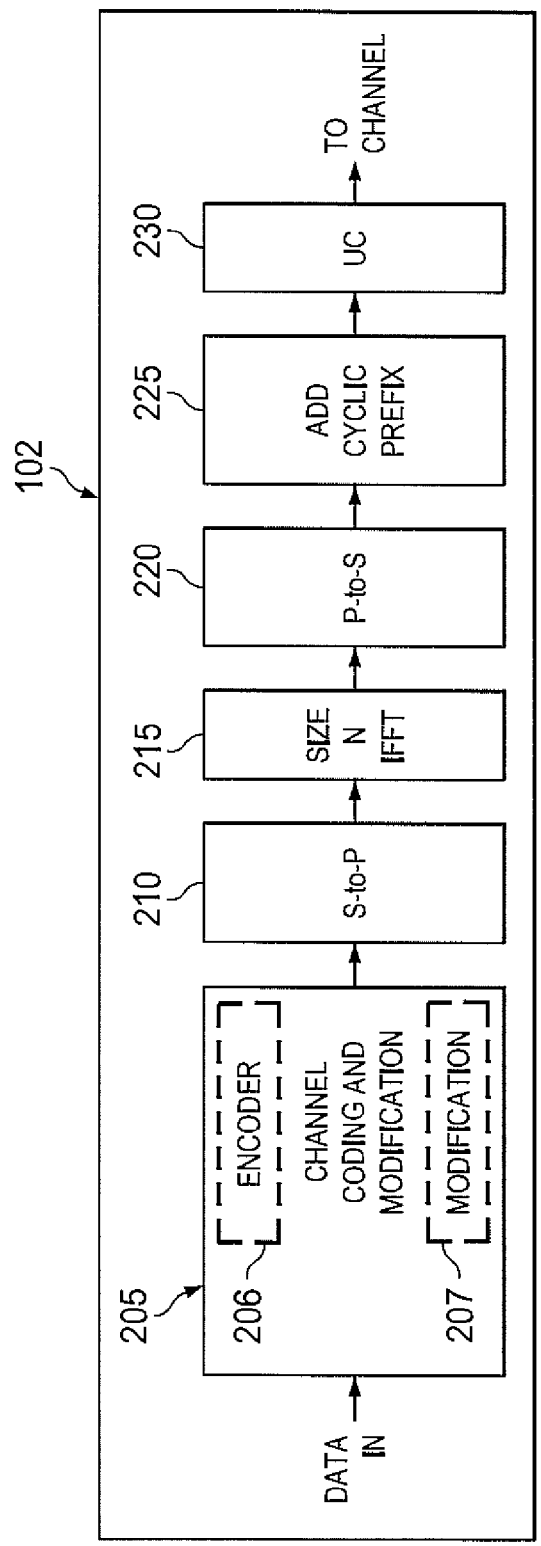
FIG. 2A illustrates a high-level diagram of an orthogonal frequency division multiple access transmit path according to an exemplary embodiment of the disclosure.
Figure 2B:
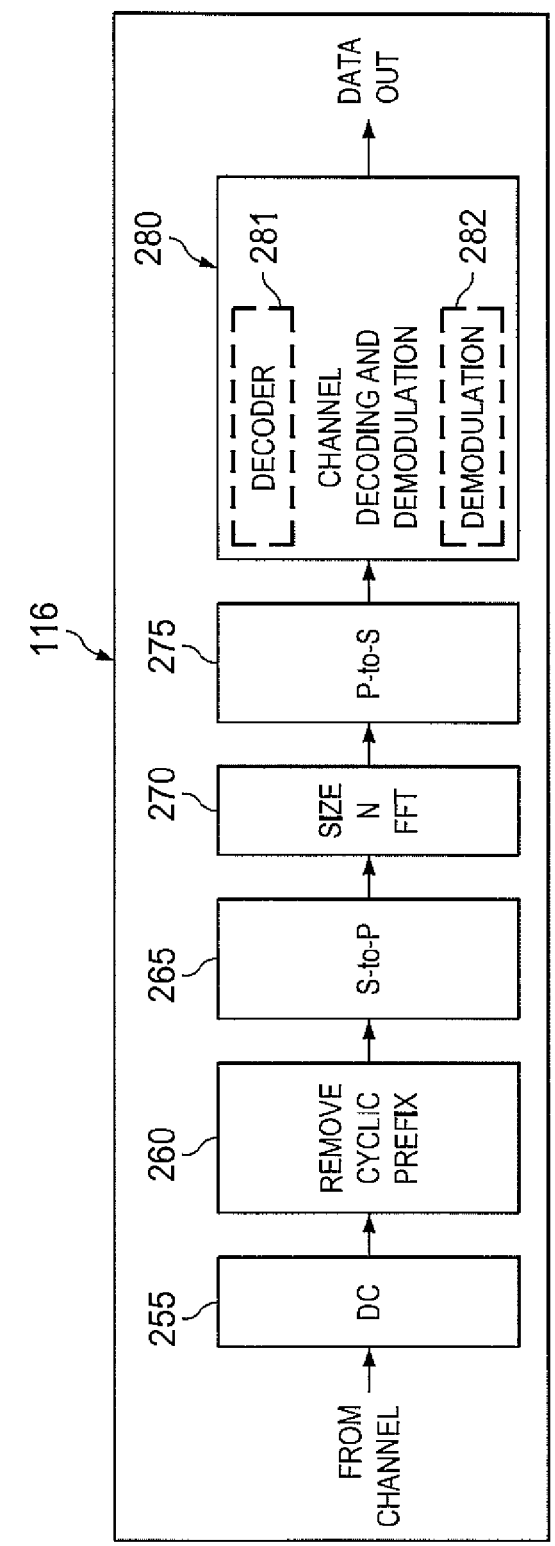
FIG. 2B illustrates a high-level diagram of an orthogonal frequency division multiple access receive path according to an exemplary embodiment of the disclosure.

FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in subscriber station (SS) 116 for the purposes of illustration and explanation only. However, it will be understood by those skilled in the art that the OFDMA receive path may also be implemented in BS 102 and the OFDMA transmit path may be implemented in SS 116.

The transmit path in BS 102 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in SS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

In some embodiments, channel coding and modulation block 205 comprises an encoder 206 and a modulator 207. In such embodiments, the encoder 206 can include one or more blocks for coding operations. Additionally, the modulator 207 can include one or more blocks for modulation operations. In some such embodiments, the encoder 206 includes a processor (e.g., a controller or finite state machine) and a plurality of instructions stored in a memory (not illustrated) configured to cause the encoder 206 to perform a number of calculations for a coding operation.

In some embodiments, channel decoding and demodulation block 280 can be a single component configured to perform decoding and demodulation. In some embodiments, channel decoding and demodulation block 280 comprises a decoder 281 and a demodulator 282. In such embodiments, the decoder can include one or more blocks for decoding operations. Additionally, the demodulator can include one or more blocks for demodulation operations. In some such embodiments, the decoder 281 includes a processor (e.g., a controller or finite state machine) and a plurality of instructions stored in a memory (not illustrated) configured to cause the decoder 281 to perform a number of calculations for a decoding operation.

At least some of the components in FIGS. 2A and 2B may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

In BS 102, channel coding and modulation block 205 receives a set of information bits, applies coding (e.g., Turbo coding) and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and SS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at SS 116 after passing through the wireless channel and reverse operations to those at BS 102 are performed. Down-converter 255 down-converts the received signal to baseband frequency and removes cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Each of base stations 101-103 may implement a transmit path that is analogous to transmitting in the downlink to subscriber stations 111-116 and may implement a receive path that is analogous to receiving in the uplink from subscriber stations 111-116. Similarly, each one of subscriber stations 111-116 may implement a transmit path corresponding to the architecture for transmitting in the uplink to base stations 101-103 and may implement a receive path corresponding to the architecture for receiving in the downlink from base stations 101-103.

The great demand for a reliable video transmission over wireless mobile networks has produced vast challenges to engineers. Video-media can require a high transmission rate with delay constraints. Moreover, the media is transmitted over broadcast channel as streaming mobile-TV channels, or over multicast channel, such as transferring videos encapsulated in large file for large number of users. The nature of these channels in addition to the delay constraints excludes the option of having a feedback channel to acknowledge the transmission success.

Forward Error Control (FEC) schemes are suitable candidates in these scenarios. Furthermore, FEC can be used in communications over any channel. In mobile technology, a turbo code FEC scheme is adopted to achieve reliable communication. For example in the 3GPP standard, turbo code is part of the network's physical layer and has a fixed rate ranges between "⅓" and "1". This code achieves a Bit Error Rate (BER) between $10^{-5}$ and $10^{-4}$. However, the achievable packet loss rate using a turbo code FEC scheme is about "0.01". Since replacing this code is cost ineffective, an outer FEC scheme is an attractive solution; in particular, a family of FEC schemes called fountain codes is the most suitable candidate. Fountain codes are referenced in 3GPP TS 36.212: "Evolved Universal Terrestrial Radio Access (E-UTRA); Multiplexing and channel coding"; and J. Byers, M. Luby, M. Mitzenmacher, and A. Rege, "A digital fountain approach to reliable distribution of bulk data," ACM SIGCOMM Computer Communication Review, Volume 28, Issue 4, October 1998, the contents of which are hereby incorporated by reference into the present application as if fully set forth herein.

Fountain codes, are codes with the following properties: 1) rateless codes that can generate infinite number of encoded symbols (as referenced herein, a symbol is usually a packet) from the original data; 2) introduce no overhead such that the receiver can reconstruct a k-symbols message once any k encoding symbols have been received; and 3) simple such that encoding/decoding can be very fast, preferably linear in time. Approximate realizations of such codes are Reed-Solomon codes, Luby transform (LT) codes, and Raptor codes. LT codes are described in M. Luby, M. Mitzenmacher, A. Shokrollahi, and D. Spielman, "Efficient erasure correcting codes," IEEE Trans. Inf. Theory. pp. 569-584, February 2001, the contents of which are hereby incorporated by reference into the present application as if fully set forth herein. Raptor codes are described in M. Luby, "LT codes," Proc. 43rd Ann. Symp. on Foundations in Computer Science, Vancouver, BC, Canada, pp. 271-280, November 2002, the contents of which are hereby incorporated by reference into the present application as if fully set forth herein. Raptor codes are the best overall approximation of fountain code.

Raptor code is being adopted in many broadcasting systems. Currently, Digital Video Broadcasting (DVB) includes an application layer FEC (Raptor code) in Digital Video Broadcasting-Handheld (DVB-H) referenced in A. Shokrollahi, "Raptor codes," *IEEE Trans. Inf. Theory*, pp. 2551-2567, June 2006; and also for Internet Protocol Television (IPTV) delivery referenced in *ETSI TS* 102 472: "Digital Video Broadcasting (DVB); IP Datacast over DVB-H: Content Delivery Protocols"; the contents of each are hereby incorporated by reference into the present application as if fully set forth herein. Also, 3rd Generation Partnership Project (3GPP) Multimedia Broadcast Multicast Service (MBMS) incorporates the Raptor code in multicast file delivery services and video streaming as referenced in FG IPTV-C-0777: "DVB-IPI Application Layer FEC for ITU-T FG IPTV Application Layer FEC" the contents of which are hereby incorporated by reference into the present application as if fully set forth herein. The 3GPP MBMS raptor codes have been adopted in Internet Engineering Task Force (IETF) as referenced in 3GPP TS 26.346: "Multimedia Broadcast/Multicast Service (MBMS); Protocols and codecs", version 7.8.0 the contents of which are hereby incorporated by reference into the present application as if fully set forth herein.

All standards mentioned above are using the same raptor code. As such, disclosed are an alternative Raptor code encoder and decoder that are faster than the existing decoder in scenarios where the packet erasure-rate is low.

Figure 3:
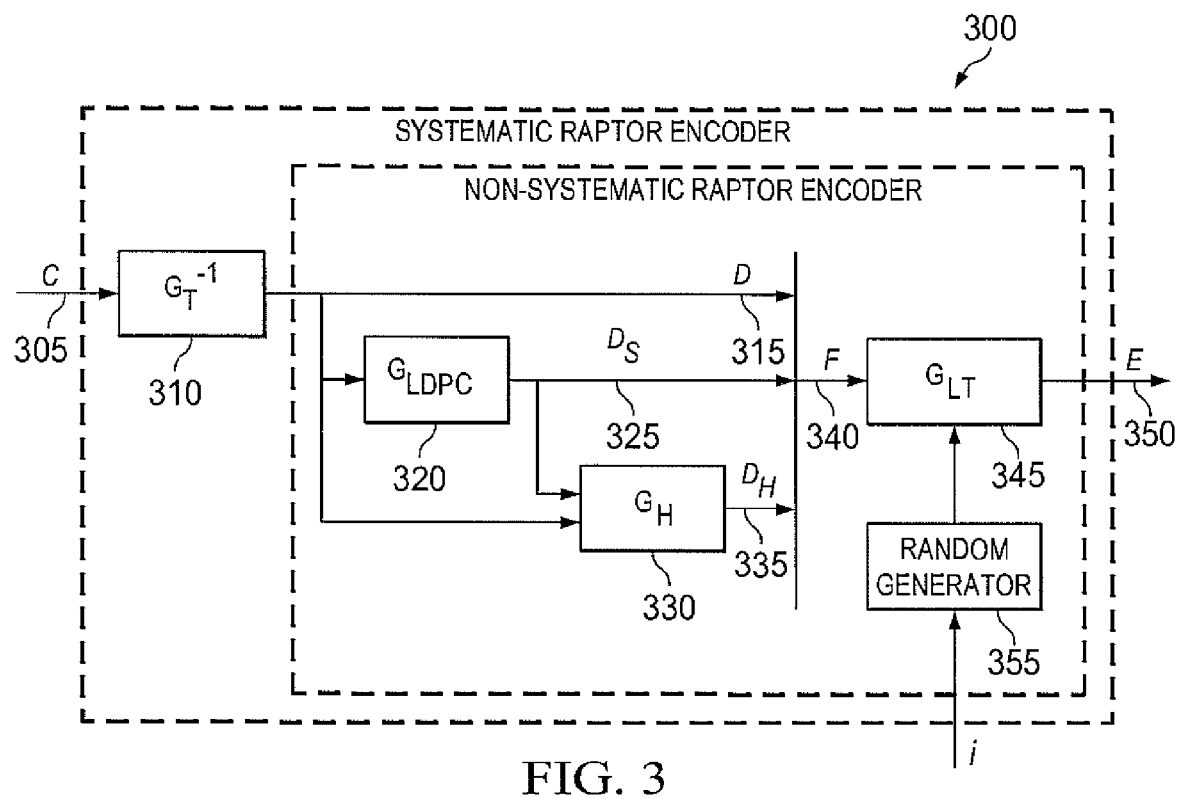
FIG. 3 illustrates an exemplary block diagram of a 3GPP MBMS raptor code.

FIG. 3 illustrates an exemplary block diagram of a 3GPP MBMS raptor code. The embodiment of the 3GPP MBMS raptor code 300 shown in FIG. 3 is for illustration only. Other embodiments of the 3GPP MBMS raptor code 300 could be used without departing from the scope of this disclosure.

Raptor code is considered a promising fountain code for its reliability and simplicity. In general, raptor code can be viewed as a concatenation of several linear codes, where the most-inner code is an LT code. This code is formed by the concatenation of stages included in two primary stages.

In a first stage, the source symbols C 305 enter a precoding stage 310 to ensure that the overall raptor code is systematic. The outputs of the precoder 310 are k precoded symbols D 315. Thereafter, the precoded symbols D 315 are encoded using a systematic Low Density Parity Check (LDPC) code 320 that introduces s parity symbols $D_S$ 325. Then, the D 315 symbols and $D_S$ 325 symbols are encoded using a Half-code 330 (i.e., a systematic High Density Parity Check (HDPC) code) to add another h parity symbols $D_H$ 335. Therefore, precoded symbols D 315, the parities $D_S$ 325 generated from the LDPC 320, and parities $D_H$ 335 generated from the HDPC 330 are obtained. These symbols D 315, $D_S$ 325 and $D_H$ 335 are combined to produce symbols at an output of the first stage. The symbols at the output of this first stage are referenced as intermediate symbols F 340.

For example, k can be the number of source symbols. Then C 305 is a k×1 vector and D is given by Equation 1:

$$D = G_T^{-1} \cdot C.$$ [Eqn. 1]

The LDPC 320 and HDPC 330 stages are defined by Equations 2 and 3:

$$D_S = G_{LDPC} D.$$ [Eqn. 2]

$$D_H = G_H \cdot [D^T | D_S^T]^T.$$ [Eqn. 3]

Note that the LDPC 320 and the HDPC 330 generator matrices are $[I_k | G_{LDPC}^T]^T$ and $[I_{k+s} | G_H^T]^T$ respectively. The LDPC 320 and the HDPC 330 generator matrices have the rates k/(k+s) and (k+s)/(k+s+h), respectively. Then, the intermediate symbols 340 are given by Equation 4:

$$F = [D^T | D_S^T | D_H^T]^T.$$ [Eqn. 4]

Intermediate symbol F 340 is an L×1 vector, where L=k+s+h.

In the last stage (i.e., also the second primary stage), an LT code 345 is applied to the intermediate symbols F 340. The output encoding symbols E 350 are produced as a result of encoding F 340 using the LT code 345. The output of the LT code 345 is given by Equation 5:

$$E = G_{LT} F.$$ [Eqn. 5]

LT codes 345 are also fountain codes. However, good LT codes 345 alone, without the outer codes of the raptor codes 300, require high computational complexity. As part of raptor codes 300, the LT encoding process 345 generates an encoding symbol in E 350, also referenced herein as $e_i$, is as follows.

First, a degree $d_i$ of the encoding symbol is chosen from a predetermined distribution. Then, $d_i$ of the symbols are chosen uniformly at random at the input of the LT code 345 (e.g., the intermediate symbols F 340). Finally, the encoding symbol $e_i$ is the component-wise exclusive-or of the $d_i$ chosen symbols. Note that the decoder 281 needs to know the set of intermediate symbols indices that are used in the encoding of each encoding symbol $e_i$. Since it is not desirable to transmit this information to the decoder 281, in order to obtain the pre-mentioned random choices, the 3GPP raptor code uses common random generators 355 at both the encoder 205 and the decoder 281. The common random generators 355 can be seeded by the index i of the encoded symbol $e_i$. This index is encoded in the packet ID for the packet carrying this symbol.

Raptor codes can be decoded iteratively using a Belief Propagation (BP) algorithm. However, in some embodiments a Maximum Likelihood (ML) decoder is used. The ML decoding process for this code consists of two stages. In a first stage, the intermediate symbols F 340 are decoded from the received encoding symbols E 350. In a second stage, the source symbols C 305 are computed from the intermediate symbols F 340.

The rows of the matrix $G_{LT}$ depend on the involved encoding symbols indices. For example, to alleviate any ambiguity while describing the 3GPP raptor decoder, the notation $G_{LT}(i_1, i_2, \ldots, i_n)$ 345 is used to refer to the matrix $G_{LT}$ 345 whose rows depend on the encoding symbols $e_{i1}, e_{i2}, \ldots, e_{in}$. Also, $E(i_1, i_2, \ldots, i_n)$ 350 is used to refer to the vector of the received encoding symbols $e_{i1}, e_{i2}, \ldots, e_{in}$.

Figure 4:
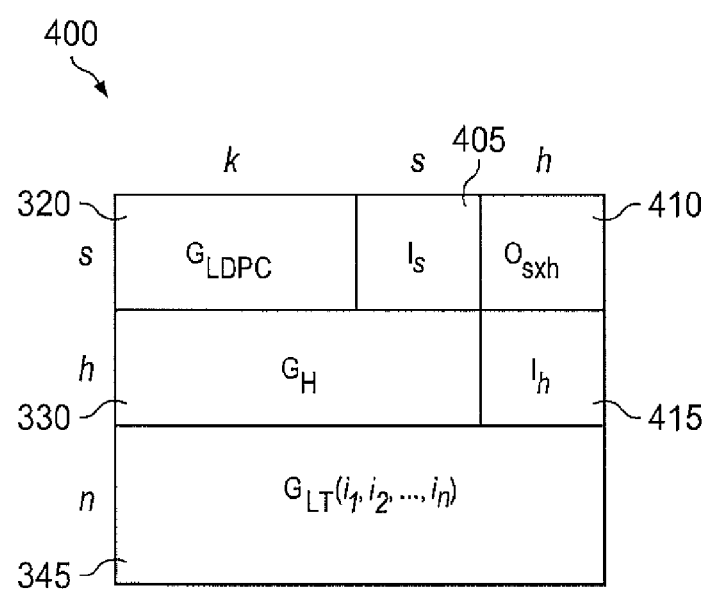
FIG. 4 illustrates an exemplary layout of a generating matrix for the 3GPP raptor code.

FIG. 4 illustrates an exemplary layout of a generating matrix for the 3GPP raptor code. The embodiment of the generating matrix 400 shown in FIG. 4 is for illustration only. Other embodiments of the generating matrix 400 could be used without departing from the scope of this disclosure.

The generating matrix 400 includes the LDPC matrix 320, a first identity matrix 405, a zero matrix 410, the HDPC matrix 330, a second identity matrix 415 and the LT matrix 345.

The decoder 281 in the first stage of the ML decoding process uses the generating matrix $A(i_1, i_2, \ldots, i_n)$ 400 to compute the intermediate symbols according to Equation 6:

$$A(i_1, i_2, \ldots, i_r) \cdot F = \begin{bmatrix} 0_{s+h \times 1} \\ E(i_1, i_2, \ldots, i_r) \end{bmatrix}.$$ [Eqn. 6]

Equation 6 has a unique solution F 340 if and only if $A(i_1, i_2, \ldots, i_n)$ has rank equal to L. This implies that r≧k is a necessary condition for decoding success. Accordingly, the decoder 281 needs at least k encoding symbols to decode. The decoder 281 uses a Gaussian elimination algorithm designed for sparse matrices to invert the matrix $A(i_1, i_2, \ldots, i_r)$ as illustrated by Equation 7:

$$F = A(i_1, i_2, \ldots, i_r)^{-1} \cdot \begin{bmatrix} 0_{s+h \times 1} \\ E(i_1, i_2, \ldots, i_r) \end{bmatrix}$$ [Eqn. 7]

Once F 340 is computed, the second stage of the ML decoding process is straightforward. Since the over-all raptor code is systematic, the relationship between the source symbols C 305 and the intermediate symbols F 340 can be defined by Equations 8:

$$A(1, 2, \ldots, k) \cdot F = \begin{bmatrix} 0_{s+h \times 1} \\ C \end{bmatrix}. \qquad [\text{Eqn. 8}]$$

Equation 8 can be re-written as Equation 9:

$$G_{LT}(1,2,\ldots,k) \cdot F = C. \qquad [\text{Eqn. 9}]$$

Therefore, the decoder 281 needs to compute the intermediate symbol F 340 and the inverse of the generating matrix 400 (e.g., $A^{-1}$). Therefore, when the system packet erasure rate is low (i.e., number of erased source symbols is small), even if only one source symbol is erased during the transmission, the pre-described decoder still needs to compute all the intermediate symbols F 340 to recover the erased source symbol. Moreover the computational complexity of this staged decoder is dominated by the computations in the first stage. Consequently, the computational complexity of the staged decoder does not depend on the packet erasure rate. In a low erasure rate scenario, the computation complexity needed to recover 1% of the source symbols is approximately the same as that needed to recover all of the source symbols.

Figure 5:
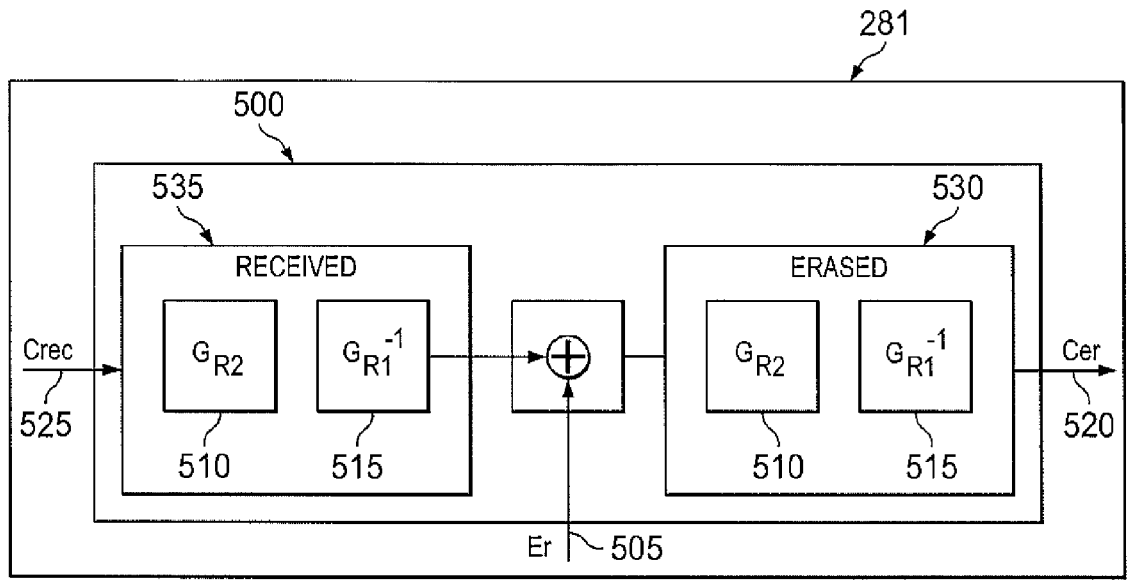
FIG. 5 illustrates a single stage decoder according to embodiments of the disclosure.

FIG. 5 illustrates a single stage decoder according to embodiments of the present disclosure. The single stage decoder 500 shown in FIG. 5 is for illustration only. Other embodiments of the single stage decoder 500 could be used without departing from the scope of this disclosure.

In some embodiments, the decoder 281 comprises a single stage raptor decoder 500. In a typical wireless link that is protected by a turbo code at the physical layer, the packet erasure rate is about one percent (1%). In the low erasure rate scenario, the computation complexity needed to recover 1% of the source symbols is proportional to the number of symbols to be recovered.

In some embodiments, the single stage raptor decoder 500 is implemented in hardware, firmware or software, or some combination of at least two of the same. In some embodiments, the single stage raptor decoder 500 is implemented in layers above the physical layer (e.g., at a higher layer). For example, the single stage raptor decoder 500 can be in the application layer for 3GPP MBMS systems and in the convergence layer for IEEE 802.16 systems.

In some embodiments, the single stage raptor decoder 500 is included as part of a turbo decoder to reduce the packet loss rate in the system.

The single stage decoder 500 is configured to recover symbols based on the amount of erased symbols. It will be understood that a symbol is a codeword in embodiments wherein the single stage raptor decoder 500 is in the physical layer, a symbol is a MAC packet in embodiments wherein the single stage raptor decoder 500 is in the convergence layer, a symbol is an IP packet in embodiments wherein the single stage raptor decoder 500 is in the application layer, and so forth. The derivation is starts with Equations 1-3, illustrated above. $G_H$, from Equation 3, can be rewritten as illustrated by Equation 10:

$$G_H = [G_{H1} | G_{H2}]. \qquad [\text{Eqn. 10}]$$

In Equation 10, $G_{H1}$ is an h×k matrix formed from the first k columns of $G_H$, and $G_{H2}$ is an h×s matrix formed from the remaining s columns of $G_H$. Substituting the formula for $D_S$, DH can be written as Equation 11:

$$D_H = [G_{H1} | G_{H2}] \cdot [D^T | (G_{LDPC} \cdot D)^T]^T. \qquad [\text{Eqn. 11}]$$

Equation 11 can be re-arranged to form Equation 12:

$$D_H = (G_{H1} + G_{H2} \cdot G_{LDPC}) \cdot D. \qquad [\text{Eqn. 12}]$$

Using Equations 4 and 5, the encoding symbol E 350 can be written as illustrated by Equation 13:

$$E = G_{LT} F = G_{LT} [D^T | D_S^T | D_H^T]^T. \qquad [\text{Eqn. 13}]$$

Equation 13 also can re-written as Equation 14:

$$E = [G_{LT1} | G_{LT2} | G_{LT3}] \cdot [D^T | (G_{LDPC} \cdot D)^T | ((G_{H1} + G_{H2} \cdot G_{LDPC}) \cdot D)^T]^T. \qquad [\text{Eqn. 14}]$$

In Equation 14, $G_{LT1}$, $G_{LT2}$, and $G_{LT3}$ consist of the first k columns, the following s columns, and the last h columns of $G_{LT}$, respectively. Equation 14 further can be re-arranged in the form illustrated by Equation 15:

$$E = (G_{LT1} + G_{LT2} \cdot G_{LDPC} + G_{LT3} \cdot (G_{H1} + G_{H2} \cdot G_{LDPC})) \cdot D. \qquad [\text{Eqn. 15}]$$

A new matrix, $G_{R,nonsys}$, is a non-systematic generating matrix. The non-systematic generating matrix is defined by Equation 16:

$$G_{R,nonsys} = G_{LT1} + G_{LT2} \cdot G_{LDPC} + G_{LT3} \cdot (G_{H1} + G_{H2} \cdot G_{LDPC}). \qquad [\text{Eqn. 16}]$$

$G_{R,nonsys}$ is referenced as the non-systematic generating matrix because, using Equations 15 and 16 yields Equation 17:

$$G_{R,nonsys} \cdot D = E. \qquad [\text{Eqn. 17}]$$

Using Equation 1, Equation 17 can be re-written as Equation 18:

$$G_{R,nonsys} \cdot G_T^{-1} \cdot C = E. \qquad [\text{Eqn. 18}]$$

Therefore, the systematic generating matrix is also defined by Equation 19:

$$G_{R,sys} = G_{R,nonsys} \cdot G_T^{-1}. \qquad [\text{Eqn. 19}]$$

In the systematic generating matrix, the first k rows are the identity matrix (since it is systematic and assuming that the encoded symbols $e_i$, i=1, 2, . . . , k, are equal to the source symbols). Therefore, $G_T^{-1}$ is the inverse of the first k rows of $G_{R,nonsys}$.

Another new matrix $G_{R1}$ is created from the first k rows of $G_{R,nonsys}$ in Equation 16. An additional new matrix $G_{R2}$ 510 is created from the remaining rows. As such, $G_T^{-1} = G_{R1}^{-1}$. Since $G_T^{-1}$ is already known at the decoder 500, $G_{R1}^{-1}$ 515 also is already known at the decoder 500.

E 350 is denoted by $E_r$ 505 for the set of received encoding symbols with index i>k. $E_r$ 505 is defined by Equation 20:

$$E_r = (G_{R2} \cdot G_{R1}^{-1}) \cdot C. \qquad [\text{Eqn. 20}]$$

Further, C 305 is denoted by $C_{erased}$ 520 for the set of erased source symbols and by $C_{received}$ 525 for the set of received source symbols. Then, Equation 20 can be re-written as Equation 21:

$$E_r = (G_{R2} G_{R1}^{-1})_{[erased]} \cdot C_{erased} + (G_{R2} G_{R1}^{-1})_{[received]} \cdot C_{received}. \qquad [\text{Eqn. 21}]$$

In Equation 21, $(G_{R2} G_{R1}^{-1})_{[erased]}$ 530 and $(G_{R2} G_{R1}^{-1})_{[received]}$ 535 are the columns of $G_{R2} G_{R1}^{-1}$ with indices equal to the indices of the erased source symbols and the indices of the received symbols, respectively. Finally, the single stage decoder 500 utilizes Equation 22 to recover erased symbols.

$$C_{erased} = (G_{R2} \cdot G_{R1}^{-1})_{[erased]}^{-1} \cdot (E_r + (G_{R2} \cdot G_{R2}^{-1})_{[received]} \cdot C_{received}). \qquad [\text{Eqn. 22}]$$

The single stage decoder 500 uses Equation 22 to recover erased symbols as opposed to the multi-stage decoders that need to invert the generating matrix $A(i_1, i_2, \ldots, i_r)$, regardless of the number of erased source symbols, in order to recover erased symbols. The generating matrix is an L×L matrix. As opposed to the multi-stage decoder, the single stage decoder 500 inverts a erased-recovery matrix $(G_{R2} G_{R1}^{-1})_{[erased]}$ 530. The erased-recovery matrix $(G_{R2} G_{R1}^{-1})_{[erased]}$ 530 has a dimension equal to the number of erased symbols.

For example, when k=1024 and symbol erasure rate is 1%, the multi-stage decoder needs to invert a 1095×1095 sparse matrix with computational complexity on the order of '15000'. However, the single stage decoder 500 needs to find the inverse of the erased-recovery matrix that is a 10×10 dense matrix with a computational complexity on the order of '1000'.

Further, the precoding matrix $G_{R1}^{-1}$ 515 depends only on the parameter k. As such, there is no need to compute this inverse at the transmission of each source block as long as the same k is used as in the DVB-H and IETF standards. The precoding matrix $G_{R1}^{-1}$ 515 is known at the decoder 500 and can be saved.

Figure 6:
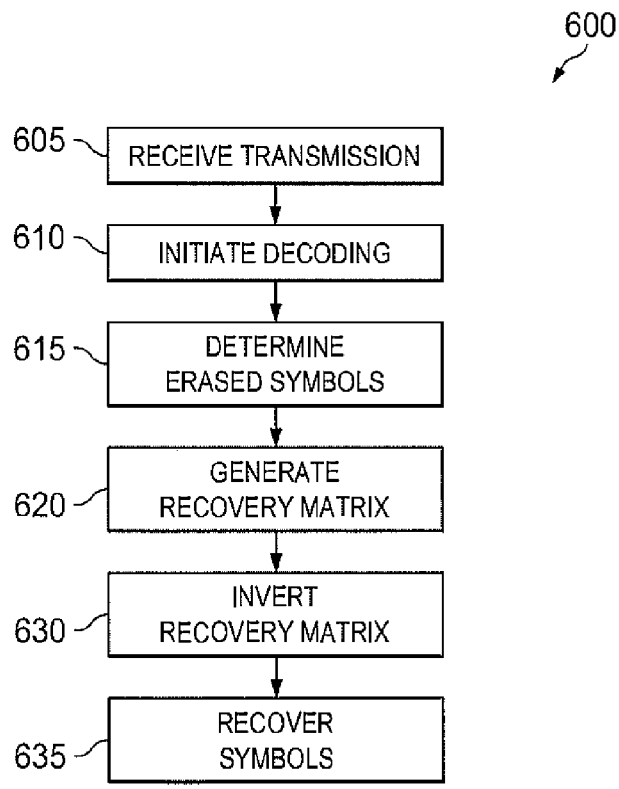
FIG. 6 illustrates a process for recovering symbols in a wireless transmission according to embodiments of the present disclosure.

FIG. 6 illustrates a process for recovering symbols in a wireless transmission according to embodiments of the present disclosure. The embodiment of the process for recovering symbols 600 shown in FIG. 6 is for illustration only. Other embodiments for the process for recovering symbols 600 could be used without departing from the scope of this disclosure.

In step 605, a receiver in a wireless communication device receives a wireless transmission. The wireless communication device can be, but is not limited to, a subscriber station, a base station or a relay station.

A decoding operation is initiated in step 610 if one or more symbols are erased. For example purpose, the receiver described with respect to FIG. 6 includes a decoder 281 that comprises a single stage decoder 500. However, alternative embodiments with raptor encoder/decoders apply equally. The single stage decoder 500 is configured to perform a decoding operation.

In step 615, the decoder 500 determines the erased symbols among the source symbols. For example, the decoder 500 may compute the erasure rate. The symbol erasure rate is defined by the number of erased symbols from the number of source symbols.

In step 620, the decoder 500 generates an erased recovery matrix. The recovery matrix is generated based on the set of erased symbols. The size of the recovery matrix is based on the number of erased symbols such that a small number of erasures causes a small recovery matrix and a large number of erasures causes a large recovery rate. For example, when transmitting 1000 source symbols, a symbol erasure rate of 1% causes the generation of a 10×10 matrix. The erased recovery matrix is generated from a portion of non-systematic matrix and a precoding matrix. The decoder 500 also generates a received recovery matrix based on a portion of the non-systematic matrix and the precoding matrix.

The decoder 500 inverts the erased recovery matrix in step 625. The decoder 500 inverts the erased recovery matrix for use in determining the erased symbols.

In step 630, the decoder 500 recovers erased symbols based on a function of the inverted erased recovery matrix. The decoder 500 executes Equation 22 in order to recover the erased symbols. In Equation 22, the erased recovery matrix is represented by $(G_{R2} G_{R1}^{-1})_{[erased]}$ 530.

The complexity of the single stage decoder 500 varies with the packet erasure rate. Therefore, in a scenario with low packet eraser rate, which is usually the case in wireless links protected by physical turbo code, the reduction in complexity is vast.

Figure 7:
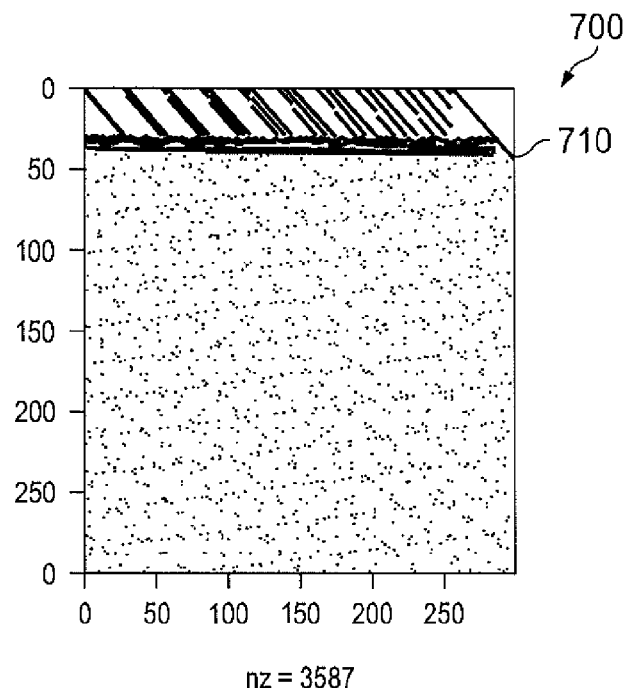
FIG. 7 illustrates an embodiment of the generating matrix $A(1, 2, \ldots, 256)$ for the 3GPP raptor code with k=256 according to embodiments of the present disclosure.

FIG. 7 illustrates an embodiment of the generating matrix A(1, 2, . . . , 256) for the 3GPP raptor code with k=256 according to embodiments of the present disclosure. The embodiment of the generating matrix A(1, 2, . . . , 256) 700 shown in FIG. 7 is for illustration only. Other embodiments could be used without departing from the scope of this disclosure.

A drawback in the 3GPP raptor code described herein above is the existence of the Half-code because all parts of the matrix $A(i_1, i_2, \ldots, i_n)$ 700 are sparse except $G_H$. For example, in FIG. 7, a dot represents a logical "1" in the matrix (recall that the elements of this matrix are either zero (0) or one (1)), and, as such, it is evident that $G_H$ has high density of ones. Further, the region 710 represents the HDPC 330. As the complexity of finding the inverse of this matrix is proportional to the number of non-zero elements in it, the computational complexity can be reduced by removing the Half-code segment. Another motive for getting rid of the Half-code is related to memory requirements. Since only the non-zero elements of a sparse matrix need to be saved, a lower number of non-zero elements results in lower memory requirements.

However, removing the Half-code can degrade the performance of the code. Therefore, in some embodiments, the Half-code is removed and the parity symbols are accumulated at the output of the LDPC code. Combining LDPC codes with accumulators results in codes with good minimum distance properties.

Figure 8:
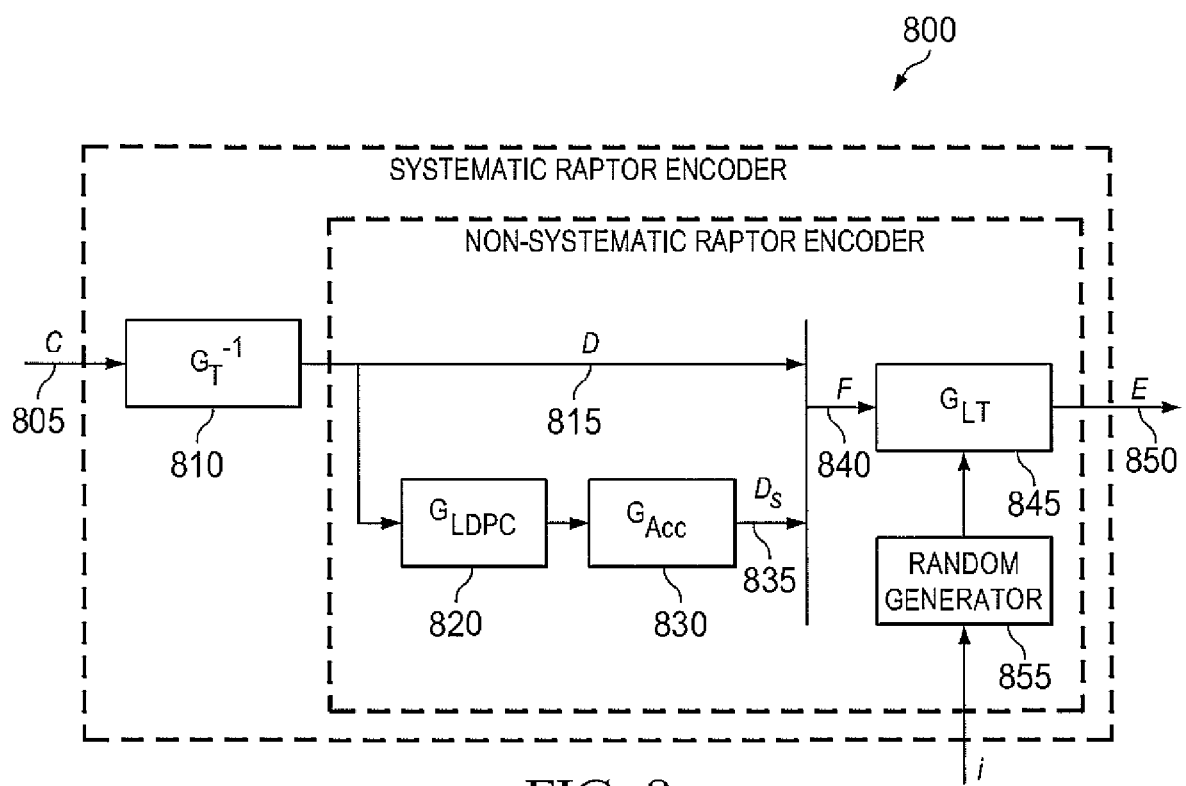
FIG. 8 illustrates an exemplary block diagram of a raptor code I according to embodiments of the present disclosure.

FIG. 8 illustrates an exemplary block diagram of a 3GPP MBMS raptor code I according to embodiments of the present disclosure. The embodiment of the 3GPP MBMS raptor code I 800 shown in FIG. 8 is for illustration only. Other embodiments of the 3GPP MBMS raptor code I 800 could be used without departing from the scope of this disclosure.

In a first stage, the source symbols C 305 enter a precoding stage 810 to ensure that the overall raptor code is systematic. The precoding stage 810 ensures that the overall raptor code is systematic. And so, it has the same functionality as the precoding stage 310 discussed hereinabove with respect to FIG. 3. The outputs of the precoder 810 are k precoded symbols D 815. Thereafter, the precoded symbols 815 are encoded using a systematic LDPC code 820, which introduces s parity symbols. The LDPC code 820 can be the same as the LDPC code 320 discussed hereinabove with respect to FIG. 3. The output from the LDPC code 820 is input into an accumulator 830. The outputs from the accumulator 830 are s parity symbols $D_S$ 835. Therefore, precoded symbols D 815 and the parities $D_S$ 835 generated from the LDPC 820 and accumulator 830 are obtained. These symbols, D 815 and $D_S$ 835, are combined to produce symbols at an output of the first stage. The symbols at the output of this first stage are referenced as intermediate symbols F 840. Therefore, the intermediate symbols 840 are generated without using a half-code (e.g., without using HDBC). As a result, the intermediate symbols, F 840, are generated from a group consisting of the precoded symbols, 815 and the parity symbols 825.

In the raptor code I 800 $D_S$ is defined by Equation 23 and F is defined by Equation 24:

$$D_S = [G_{LDPC} | G_{Acc}] \cdot D \qquad \text{[Eqn. 23]}$$

$$F = [D^T | D_S^T]^T. \qquad \text{[Eqn. 24]}$$

Where the length of the vector F is L=k+s, and $G_{Acc}$ is the s×s matrix illustrated in Equation 25:

$$G_{Acc} = \begin{bmatrix} 1 & & & & \\ 1 & 1 & & & \\ & 1 & \ldots & & \\ & & & 1 & \\ & & & 1 & 1 \end{bmatrix} \quad \text{[Eqn. 25]}$$

In the last stage (e.g., also the second primary stage), an LT code 845 is applied to the intermediate symbols F 340. The LT code 845 can be the same as the LT code 345 discussed hereinabove with respect to FIG. 3. The output encoding symbols E 850 are produced as a result of encoding F 840 using the LT code 845. The output of the LT code 845 is given by Equation 5 above (and reproduced here):

$$E = G_{LT} F. \quad \text{[Eqn. 5]}$$

LT codes 845 are also fountain codes. However, good LT codes 845 alone, without the outer codes of the raptor codes 800, require high computational complexity. As part of raptor codes 800, the LT codes encoding process 845 to generate an encoding symbol in E 850, referenced herein as $e_i$, is as follows.

First, a degree $d_i$ of the encoding symbol is chosen from a predetermined distribution. Then, the $d_i$ of the symbols is uniformly chosen at random at the input of the LT code 845 (e.g., the intermediate symbols F 840). Finally, the encoding symbol $e_i$ is the component-wise exclusive-or of the $d_i$ chosen symbols. Note that the decoder 281 needs to know the set of intermediate symbols indices that are used in the encoding of each encoding symbol $e_i$. Since it is not desirable to transmit this information to the decoder 281, in order to obtain the pre-mentioned random choices, the 3GPP raptor code uses common random generators 855 at both the encoder 205 and the decoder 281. The common random generators 855 can be seeded by the index i of the encoded symbol $e_i$. This index is encoded in the packet ID for the packet carrying this symbol.

Figure 9:
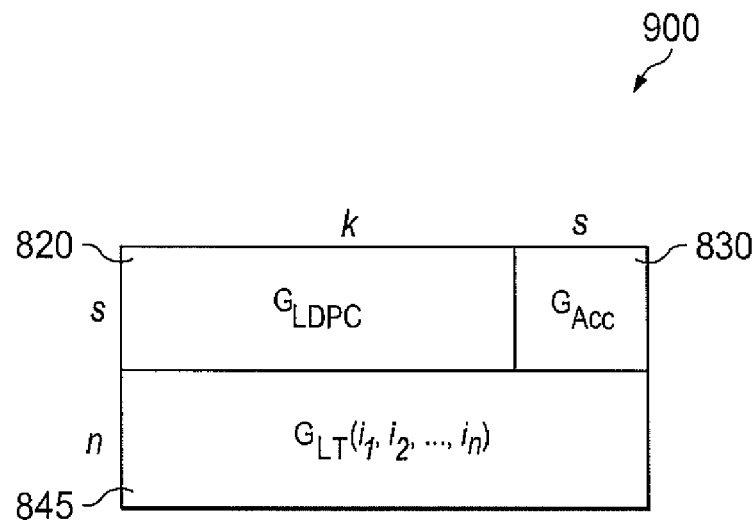
FIG. 9 illustrates an exemplary layout of a generating matrix for the raptor code I according to embodiments of the present disclosure.

FIG. 9 illustrates an exemplary layout of a generating matrix for the 3GPP raptor code I according to embodiments of the present disclosure. The embodiment of the generating matrix 900 shown in FIG. 9 is for illustration only. Other embodiments of the generating matrix 900 could be used without departing from the scope of this disclosure.

The generating matrix 900 includes the LDPC matrix 820, an accumulator matrix 830, and the LT matrix 845. In some embodiments, the LT matrix 845 is the same as the LT matrix 345. Accordingly, in such embodiments, the LT matrix 345 is optimized to the raptor code 300. The degree distribution of the LT code (e.g., LT matrix 345 and LT matrix 845) greatly affects the performance. The first raptor code I (labeled "First") 800 uses the degree distribution Pr{d=1}=0.009767, Pr{d=2}=0.459043, Pr{d=3}=0.210964, Pr{d=4}=0.113393, Pr{d=10}=0.111342, Pr{d=11}=0.079864, Pr{d=40}=0.015628, which is the same as the one optimized in the 3GPP raptor code 300.

Changing the code, however, may require optimizing the LT degree distribution with the new structure. In some embodiments, the LT matrix 845 is optimized to the raptor code I 800. In such embodiments, the LT matrix 845 may be differential from the LT matrix 345. For this reason a raptor code decoder with a differential evolution toolbox is implemented to find the distribution which optimizes the performance. A different evolution is defined in Storn, K. Price, "Differential Evolution-a simple and efficient adaptive scheme for global optimization over continuous space", Technical Report TR-95-012, ICSI, 1995, the contents of which are hereby incorporated by reference in their entirety.

Keeping the set of degrees unchanged from that in the 3GPP raptor code, the obtained distribution is Pr{d=1}=0.009767, Pr{d=2}=0.400267, Pr{d=3}=0.208904, Pr{d=4}=0.125884, Pr{d=10}=0.005633, Pr{d=11}=0.230113, Pr{d=40}=0.019433. The first raptor code I 800 that uses the new distribution is referred herein as the optimized raptor code I 800' (It will be understood that optimized raptor code I 800' has the same general structure as first raptor code I 800 and, therefore, optimized raptor code I 800' is described with reference to FIG. 8 as well and reference number 800' is not specifically shown.)

Figure 10:
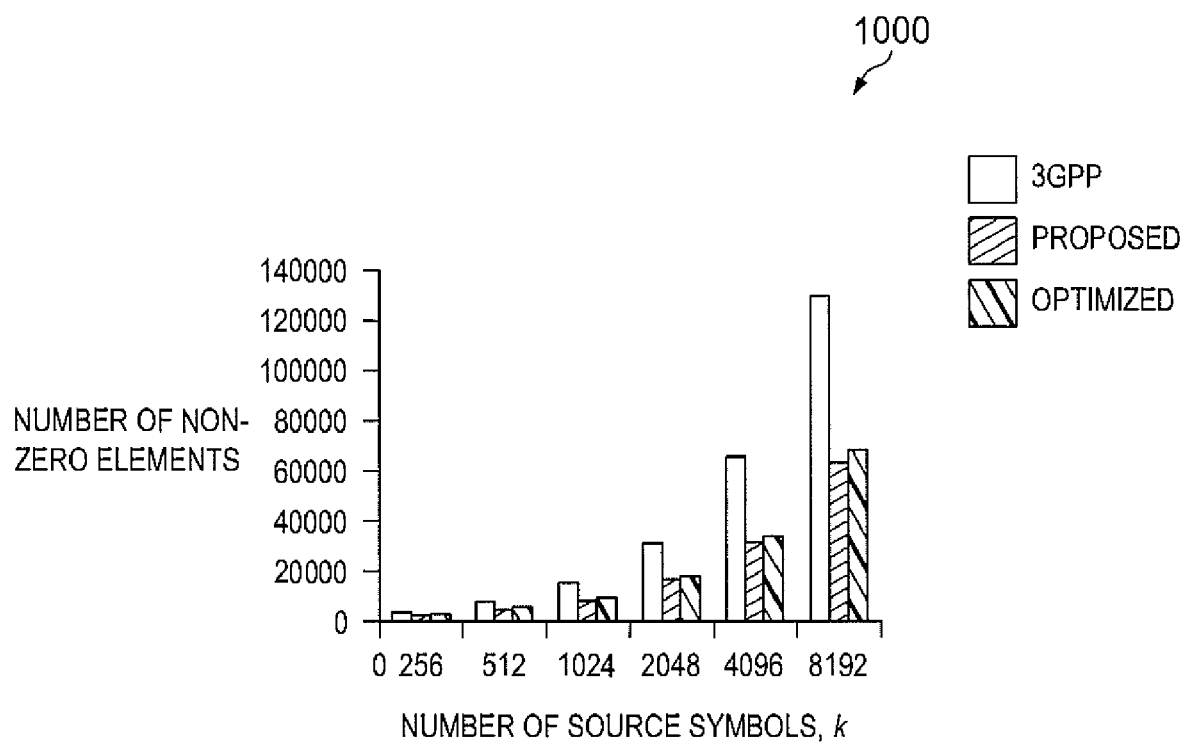
FIG. 10 illustrates a graph comparing the number of non-zero elements in the matrix $A(i_1, i_2, \ldots, i_n)$ according to embodiments of the present disclosure.
Figure 11:
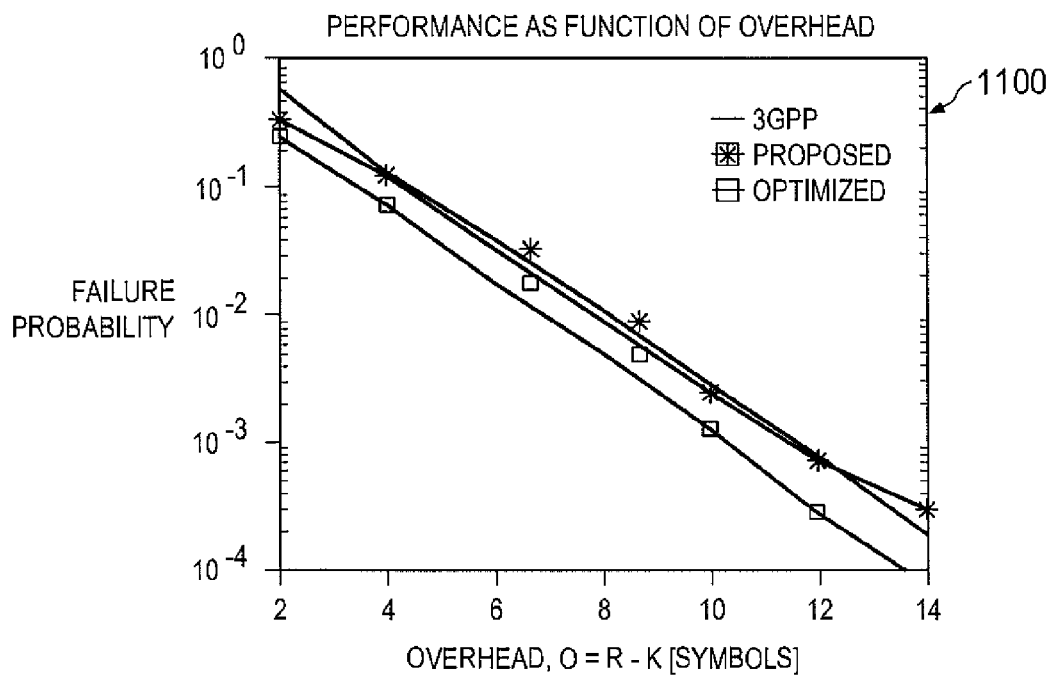
FIG. 11 illustrates a graph comparing the block failure rate as a function of overhead with regard to the raptor codes according to embodiments of the present disclosure.

The $A(i_1, i_2, \ldots, i_n)$ matrix density and the block failure rate for the optimized raptor code I (labeled, "Optimized") 800' are compared to those for the previous raptor codes (e.g., the 3GPP raptor code 300 and the "first" raptor code I 800) in FIG. 10 and FIG. 11, respectively.

FIG. 10 illustrates a graph comparing the number of non-zero elements in the matrix $A(i_1, i_2, \ldots, i_n)$ according to embodiments of the present disclosure. The embodiment of the graph 1000 shown in FIG. 10 is for illustration only. Other embodiments could be used without departing from the scope of this disclosure.

The graph 1000 illustrates the complexity of the generating matrix (and associated raptor code) for each of the raptor codes. For example, the number of non-zero elements for the 3GPP raptor code 300 is just over 60,000 for k=4,096 (number of source symbols equals 4,096) and approximately 130,000 for k=8,192 (number of source symbols equals 8,192). The number of non-zero elements decreases with the use of the raptor code I 800 and optimized raptor code I 800'. For example, the number of non-zero elements for the raptor code I 800 is approximately 35,000 for k=4,096 (number of source symbols equals 4,096) and just over 60,000 for k=8,192 (number of source symbols equals 8,192). Additionally, the number of non-zero elements for the optimized raptor code I 800' is approximately 37,000 for k=4,096 (number of source symbols equals 4,096) and approximately 63,000 for k=8,192 (number of source symbols equals 8,192). Accordingly, the number of non-zero elements is substantially reduced by approximately fifty percent (50%, e.g., reduced by a factor of ½).

FIG. 11 illustrates a graph comparing the block failure rate as a function of overhead with regard to the raptor codes according to embodiments of the present disclosure. The embodiment of the graph 1100 shown in FIG. 11 is for illustration only. Other embodiments could be used without departing from the scope of this disclosure.

The graph 1100 illustrates the performance of the three raptor codes as a function of overhead. As the overhead increases, the probability of failure decreases. For example, graph 1100 illustrates that two packets can be saved using the optimized raptor code I 800' over the first raptor code I 800 or the 3GPP raptor code 300. Therefore, the optimized raptor code I 800' can achieve the same block failure rate of the 3GPP raptor code 300 with two less overhead symbols (symbols are packets).

Figure 12:
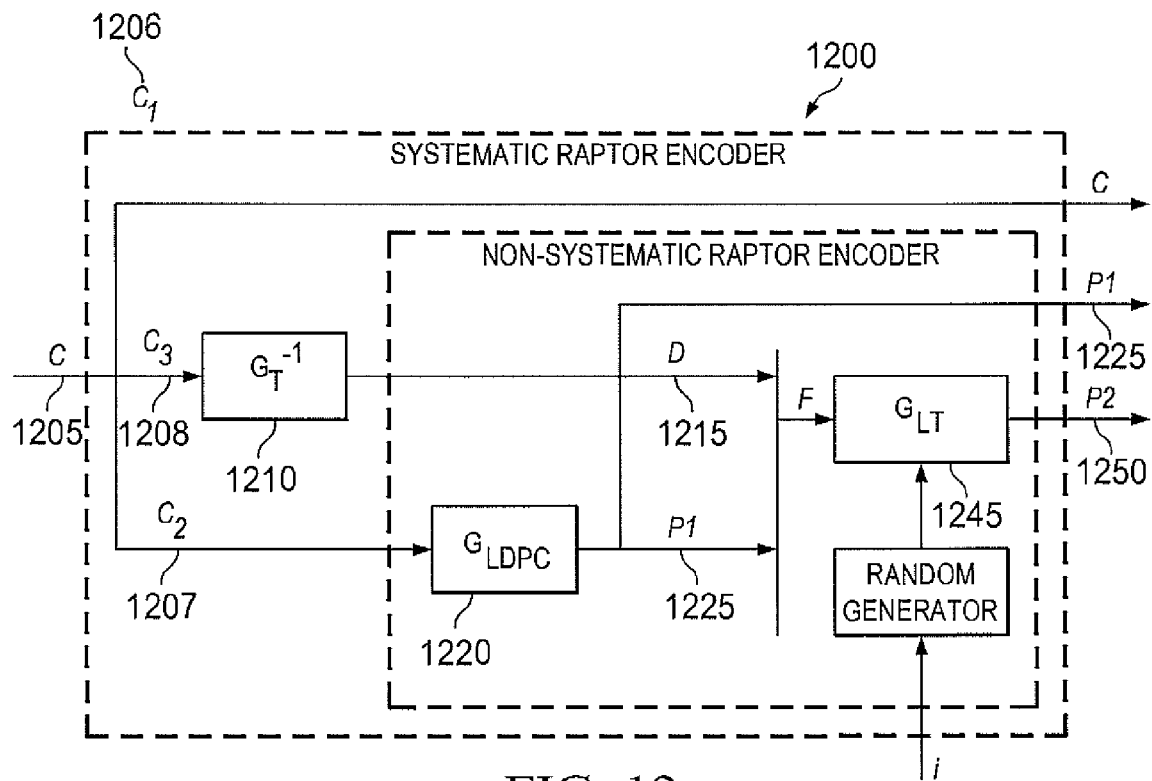
FIG. 12 illustrates an exemplary block diagram of a raptor code II according to embodiments of the present disclosure.

FIG. 12 illustrates an exemplary block diagram of a raptor code II according to embodiments of the present disclosure. The embodiment of the raptor code II 1200 shown in FIG. 12 is for illustration only. Other embodiments of the 3GPP MBMS raptor code II 1200 could be used without departing from the scope of this disclosure.

The raptor code II 1200 encodes the source symbols C 1205 using the LDPC code 1220 instead of encoding the precoded source symbols D. The LDPC code 1220 may be the same as the LDPC code 320 discussed hereinabove with respect to FIG. 3 and/or the LDPC code 820 discussed hereinabove with respect to FIG. 8. Then, the resultant parity packets P1 1225 are encoded along with the precoded symbols D 1215 to produce the repair packets P2 1250.

The 3GPP raptor code II 1200 design can provide different levels of protection for users with different capabilities. For example, BS 102 can transmit C 1205, P1 1225, and P2 1250. SS 116 can receive one or more of C 1205, P1 1225, and P2 1250. For example, receiving C 1205 alone provides service for users with no Application Layer FEC (AL-FEC) capabilities on the cost of quality and/or latency. Next, receiving C 1205 and P1 1225 provides another level of protection for users that are capable of decoding the simple LDPC part of the code but not the entire raptor code. Furthermore, receiving C 1205, P1 1225, and P2 1250 provides a higher level of protection for users that are fully capable of decoding raptor codes.

In some embodiments, BS 102 can transmit different versions of C 1205. The source symbol, C 1205, can be split into a primary set $C_1$ 1206 and a secondary set $C_2$ 1207. SS 116 can receive one or more of C 1205, $C_1$ 1206 and $C_2$ 1207 (e.g., via $C_1$ 1206, P1 1225, and P2 1250). For example, instead of transmitting C 1205, BS 102 transmits $C_1$ 1206 (e.g., $C_1$ 1206 transmitted without coding). BS 102 also can encode $C_2$ 1207 using the LDPC code 1220. BS 102 also precodes C 1205 using the precoding stage 1210. The precoding stage 1210 may be the same as the precoding stage 310 discussed hereinabove with respect to FIG. 3 and/or the precoding stage 810 discussed hereinabove with respect to FIG. 8. In some embodiments, BS 102 precodes either $C_1$ 1206 or $C_2$ 1207. Then, the resultant parity packets P1 1225 are encoded along with the precoded symbols D 1215 to produce the repair packets P2 1250. SS 116, therefore, can receive $C_1$ 1206 directly as well as one or more of C 1205 and $C_2$ 1207 encoded in P1 1225 and P2 1250.

It will be understood that BS 102 can transmit the source symbols in other combinations such as, but not limited to, by splitting C 1205 into three parts such that $C_1$ 1206 is transmitted uncoded, $C_2$ 1207 is coded using the LDPC code 1220 and $C_3$ 1208 is transmitted using precoding stage 1210. Additionally, BS 102 can transmit the source symbols the transmitting $C_2$ 1207 directly and encoded using one of the LDPC code 1220 or the precoding stage 1210 and transmit one of C 1205 or $C_1$ 1206 using the other of the LDPC code 1220 or the precoding stage 1210.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless communications network, a wireless communications device configured to transmit and receive encoded transmissions, the wireless communications device comprising:
a raptor encoder, the raptor encoder comprising:
a precoder stage configured to receive a plurality of source symbols and to produce a plurality of precoded symbols,
a Low Density Parity Check (LDPC) stage configured to produce a plurality of parity symbols, and
a Luby transform stage configured to encode a plurality of intermediate symbols to produce a plurality of encoded symbols, the plurality of intermediate symbols are generated from a group consisting of the precoded symbols and the plurality of parity symbols;
wherein the raptor encoder is configured to output at least the plurality of encoded symbols.

2. The wireless communications device as set forth in claim 1, wherein the raptor encoder outputs the plurality of parity symbols.

3. The wireless communications device as set forth in claim 2, wherein the wireless communications device transmits the source symbols, the plurality of parity symbols and the plurality encoded symbols.

4. The wireless communications device as set forth in claim 1, wherein the wireless communications device is configured to split the source symbols into at least a primary set of source symbols and a secondary set of source symbols.

5. The wireless communications device as set forth in claim 4, wherein the wireless communications device is configured to transmit the primary set of source symbols without coding by the raptor encoder.

6. The wireless communications device as set forth in claim 4, wherein the wireless communications device is configured to encode the secondary set with the raptor encoder.

7. The wireless communications device as set forth in claim 4, wherein the wireless communications device is configured to split the source symbols into the primary set of source symbols, the secondary set of source symbols, and a third set of source symbols and wherein the wireless communications device is configured to encode the secondary set with the precoder stage and the third set with the LDPC stage.

8. For use in a wireless communications device, a transmitter configured to raptor-encode transmissions in a wireless communications network, the transmitter comprising:
a raptor encoder, the raptor encoder comprising:
a precoder stage configured to produce a plurality of precoded symbols,
a Low Density Parity Check (LDPC) stage configured to produce a plurality of parity symbols, and
a Luby transform stage configured to encode a plurality of intermediate symbols to produce a plurality of encoded symbols, the plurality of intermediate symbols are generated from a group consisting of the precoded symbols and the plurality of parity symbols;
wherein the raptor encoder is configured to receive a plurality of source symbols and an output at least the plurality of encoded symbols.

9. The transmitter as set forth in claim 8, wherein the raptor encoder outputs the plurality of parity symbols.

10. The transmitter as set forth in claim 9, wherein the transmitter is configured to transmit the source symbols, parity symbols and encoded symbols.

11. The transmitter as set forth in claim 8, wherein the transmitter is configured to split the source symbols into at least a primary set of source symbols and a secondary set of source symbols.

12. The transmitter as set forth in claim 11, wherein the transmitter is configured to transmit the primary set of source symbols without coding by the raptor encoder.

13. The transmitter as set forth in claim 11, wherein the transmitter is configured to encode the secondary set with the raptor encoder.

14. The transmitter as set forth in claim 11, wherein the transmitter is configured to split the source symbols into the primary set of source symbols, the secondary set of source symbols, and a third set of source symbols and wherein the wireless communications device is configured to encode the secondary set with the precoder stage and the third set with the LDPC stage.

15. A method for encoding symbols to enable the recovery of erased symbols in a transmission in a wireless communications network, the method comprising:
receiving a plurality of source symbols;

precoding at least a portion of the plurality of source symbols to produce a plurality of precoded symbols;
encoding at least a portion of the plurality of source symbols to produce a plurality of parity symbols;
generating a plurality of intermediate symbols from only the plurality of precoded symbols and the plurality of parity symbols;
using a Luby Transform to encode the intermediate symbols to produce a plurality of encoded symbols; and
outputting the plurality of encoded symbols.

16. The method as set forth in claim 15, further comprising outputting at least one of the parity symbols and the source symbols.

17. The method as set forth in claim 15, further comprising splitting the source symbols into at least a first set of source symbols and a second set of source symbols.

18. The method as set forth in claim 17, further comprising outputting the first set of source symbols.

19. The method as set forth in claim 17, wherein the portion of the source symbols is the second set of source symbols.

20. The method as set forth in claim 15, further comprising outputting the parity symbols, the source symbols and encoded symbols.

21. For use in a wireless communications network, a wireless communications device configured to transmit encoded transmissions, the wireless communications device comprising:
a raptor encoder, the raptor encoder comprising:
a precoder stage configured to produce a plurality of precoded symbols,
a Low Density Parity Check (LDPC) stage coupled to the precoder stage,
an accumulator stage coupled to the LDPC stage, wherein the LDPC stage and the accumulator stage combine to produce a plurality of parity symbols; and
a Luby transform stage configured to encode a plurality of intermediate symbols to produce a plurality of encoded symbols, wherein the raptor encoder is configured to receive a plurality of source symbols and an output at least the plurality of encoded symbols.

22. The device of claim 21, wherein the LDPC stage is configured to output an initial plurality of parity symbols.

23. The device of claim 22, wherein the accumulator is configured to receive and accumulate the initial plurality of parity symbols from the LDPC stage and output the plurality of parity symbols.

24. The device of claim 21, wherein the plurality of intermediate symbols are generated from a group consisting of the precoded symbols and the plurality of parity symbols.

25. The device of claim 21, wherein a Luby transform stage is coupled to a random generator, and wherein the Luby transform stage generates the plurality of encoded symbols based in part on an input from the random generator.

26. The device of claim 25, wherein the encoded symbols are generated based on an exclusive or operation on the intermediate symbols and the input from the random generator.

27. A method for encoding symbols to enable the recovery of erased symbols in a transmission in a wireless communications network, the method comprising:
receiving a plurality of source symbols;
precoding at least a portion of the plurality of source symbols to produce a plurality of precoded symbols;
generating a plurality of parity symbols from the precoded symbols;
generating a plurality of intermediate symbols based on a group of symbols consisting of the plurality of precoded symbols and the plurality of parity symbols;
encoding, with a Luby Transform, the intermediate symbols to produce a plurality of encoded symbols; and
transmitting the plurality of encoded symbols.

28. The method of claim 27, wherein generating the plurality of parity symbols comprises generating parities from the plurality of precoded symbols.

29. The method of claim 28, wherein generating parities is performed by a Low Density Parity Check encoder.

30. The method of claim 28, wherein generating the plurality of parity symbols further comprises accumulating the parities and outputting the plurality of parity symbols.

31. The method of claim 27, wherein encoding the intermediate symbols comprises receiving an input from a random generator, the encoded symbols generated based in part on the input from the random generator.

32. The method of claim 27, wherein the encoded symbols are generated based on an exclusive or operation on the intermediate symbols and the input from the random generator.

33. For use in a wireless communications device, a transmitter including a raptor encoder configured to raptor-encode transmissions in a wireless communications network, the raptor encoder comprising:
a first stage comprising an accumulator configured to output a plurality of parity symbols, the first stage configured to receive a plurality of symbols and output a plurality of intermediate symbols, the plurality of intermediate symbols generated from a group consisting of a plurality of precoded symbols and the plurality of parity symbols; and
a second stage configured to encode the plurality of intermediate symbols to produce a plurality of encoded symbols.

34. The raptor encoder of claim 33, wherein the first stage comprises a precoder stage configured to produce a plurality of precoded symbols.

35. The raptor encoder of claim 34, wherein the first stage further comprises a Low Density Parity Check (LDPC) stage configured to receive the plurality of precoded symbols and produce a first plurality of parity symbols.

36. The raptor encoder of claim 35, wherein the accumulator receives the first number of parity symbols from the LDPC stage and outputs the plurality of parity symbols.

37. The raptor encoder of claim 33, wherein the second stage comprises a Luby transform stage.

38. The raptor encoder of claim 37, wherein the Luby transform stage is configured to receive an input from a random generator.

39. The raptor encoder of claim 38, wherein the Luby transform stage generates the encoded symbols based in part on the input from the random generator.

40. The raptor encoder of claim 39, wherein the encoded symbols are generated based on an exclusive or operation on the intermediate symbols and the input from the random generator.

* * * * *